United States Patent
Fujisaki

(10) Patent No.: US 11,545,957 B2
(45) Date of Patent: Jan. 3, 2023

(54) CRYSTAL ELEMENT AND CRYSTAL DEVICE

(71) Applicant: KYOCERA Corporation, Kyoto (JP)

(72) Inventor: Fumio Fujisaki, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 330 days.

(21) Appl. No.: 16/774,685

(22) Filed: Jan. 28, 2020

(65) Prior Publication Data

US 2020/0244248 A1    Jul. 30, 2020

(30) Foreign Application Priority Data

Jan. 28, 2019    (JP) ............................. JP2019-012294

(51) Int. Cl.
  *H03H 9/17*    (2006.01)
  *H03H 9/125*   (2006.01)
  *H03H 9/05*    (2006.01)

(52) U.S. Cl.
  CPC ............ *H03H 9/17* (2013.01); *H03H 9/0595* (2013.01); *H03H 9/125* (2013.01)

(58) Field of Classification Search
  CPC ........ H03H 9/17; H03H 9/0595; H03H 9/125; H03H 9/0519; H03H 9/1021; H03H 9/02
  See application file for complete search history.

(56) References Cited

U.S. PATENT DOCUMENTS

| | | | |
|---|---|---|---|
| 10,529,910 B2* | 1/2020 | Sato | ...................... H01L 41/047 |
| 2018/0375012 A1* | 12/2018 | Matsuo | ................. H01L 41/042 |

FOREIGN PATENT DOCUMENTS

| | | |
|---|---|---|
| JP | 2000-031781 A | 1/2000 |
| JP | 2017-085385 A | 5/2017 |
| JP | 2018-121264 A | 8/2018 |
| JP | 2018-121265 A | 8/2018 |

* cited by examiner

*Primary Examiner* — Jeffrey M Shin

(74) *Attorney, Agent, or Firm* — Volpe Koenig

(57) ABSTRACT

Provided is a crystal element that includes: a crystal piece that is in a substantially rectangular shape on a plan view; an excitation electrode part located on both main surfaces of the crystal piece; a connection lead part extended to a first short-side of the crystal piece from the excitation electrode part; a convex part located on both ends of a second short-side of the crystal piece; and a projected part located on both ends of the first short-side of the crystal piece. Further, a concave part is located in the convex part, and a recessed part is located in the projected part.

5 Claims, 8 Drawing Sheets

CRYSTAL ELEMENT AND CRYSTAL DEVICE

This application claims priority to and the benefit of Japanese Patent Application No. 2019-012294 filed on Jan. 28, 2019, the entire contents of which are incorporated herein by reference.

BACKGROUND

1. Technical Field

The present disclosure relates to a crystal element and a crystal device using the same.

2. Description of the Related Art

The crystal element includes a crystal piece in which a metal pattern having a pair of excitation electrodes and a pair of connection lead parts is formed. Such crystal piece on a plan view is in a rectangular shape configured with four straight-line sides (for example, see Patent Literature 1).

CITATION LIST

Patent Literature

Patent Literature 1: Japanese Patent Laid-Open No. 2017-85385

SUMMARY

The crystal element according to the present disclosure includes: a crystal piece that is in a substantially rectangular shape on a plan view; an excitation electrode part located on both main surfaces of the crystal piece; a connection lead part extended to a first short-side of the crystal piece from the excitation electrode part; and a convex part located on both ends of a second short-side of the crystal piece.

DETAILED DESCRIPTION OF THE EMBODIMENTS

When an alternating voltage is applied to a metal pattern having a connection electrode part and a connection lead part of a crystal element, thickness shear vibration as the main vibration is generated in a part sandwiched between excitation electrode parts while contour vibration that is secondary vibration is generated at the same time. Further, the thickness shear vibration as the main vibration leaks and propagates from the part sandwiched between the excitation electrode parts, thereby generating vibration reflected at the end of a crystal piece. As described, the contour vibration as the secondary vibration as well as the vibration leaked and propagated from the excitation electrode parts and reflected at the end of the crystal piece is called spurious vibration. The crystal element described above uses a crystal piece that is in rectangular shape on a plan view, so that the influence of the contour vibration that depends on the external size of the crystal piece and the vibration leaked, propagated, and reflected at the end of the crystal piece imposed upon the thickness shear vibration as the main vibration becomes great and the electrical characteristic may be deteriorated.

The present disclosure provides a crystal element and a crystal device capable of improving the electrical characteristic.

Hereinafter, embodiments of the present disclosure will be described by referring to the accompanying drawings. Note that the drawings used for description provided hereinafter are schematic views and that dimensional ratio and the like on the drawings are not necessarily consistent with the actual ones.

(Outline of Crystal Device)

Figure 1:
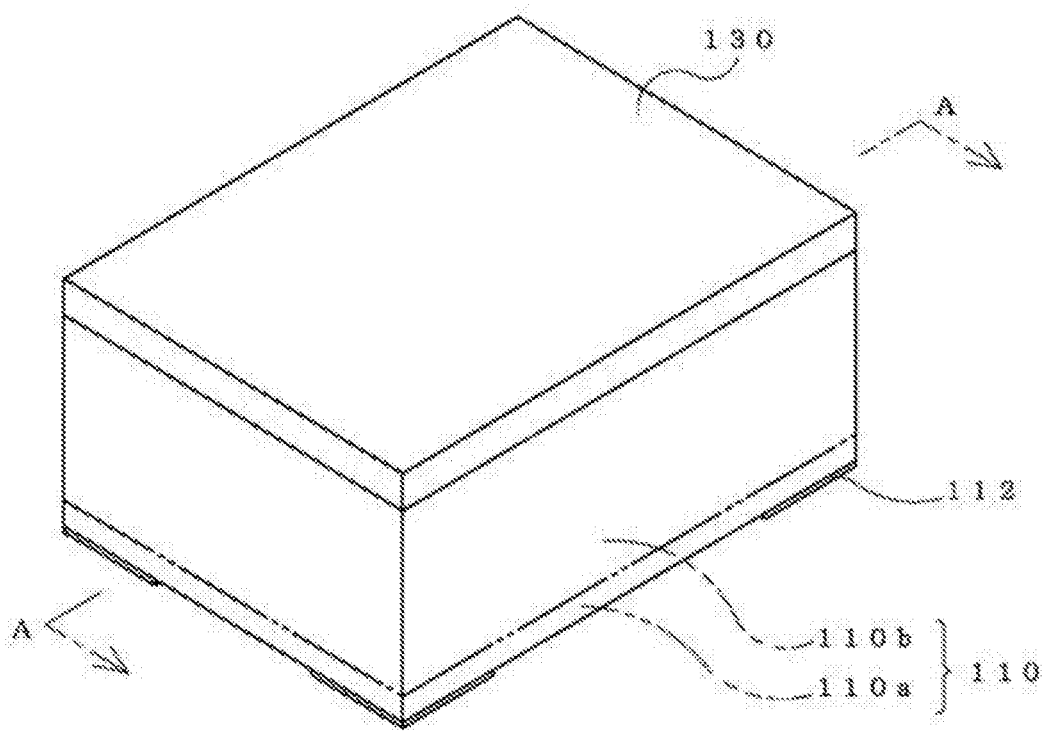
FIG. 1 is a perspective view showing a crystal oscillator that is an example of a crystal device according to an embodiment.
Figure 2:
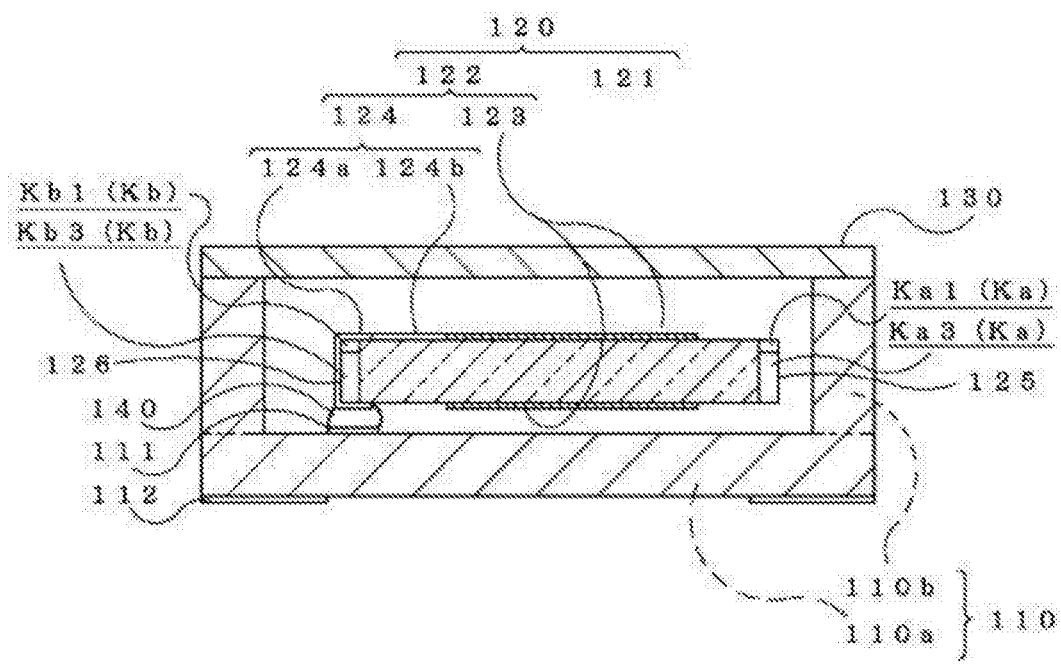
FIG. 2 is a sectional view taken along a line A-A of FIG. 1.
Figure 9:
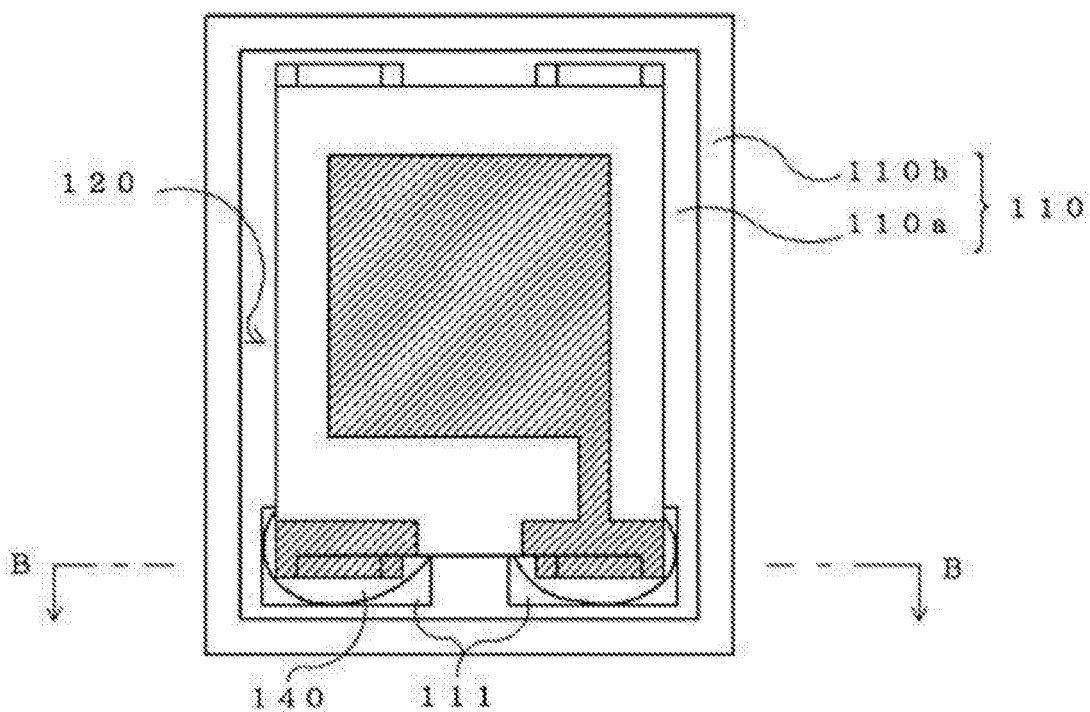
FIG. 9 is a state diagram showing a state where the crystal element according to the embodiment is mounted on a base body.
Figure 10:
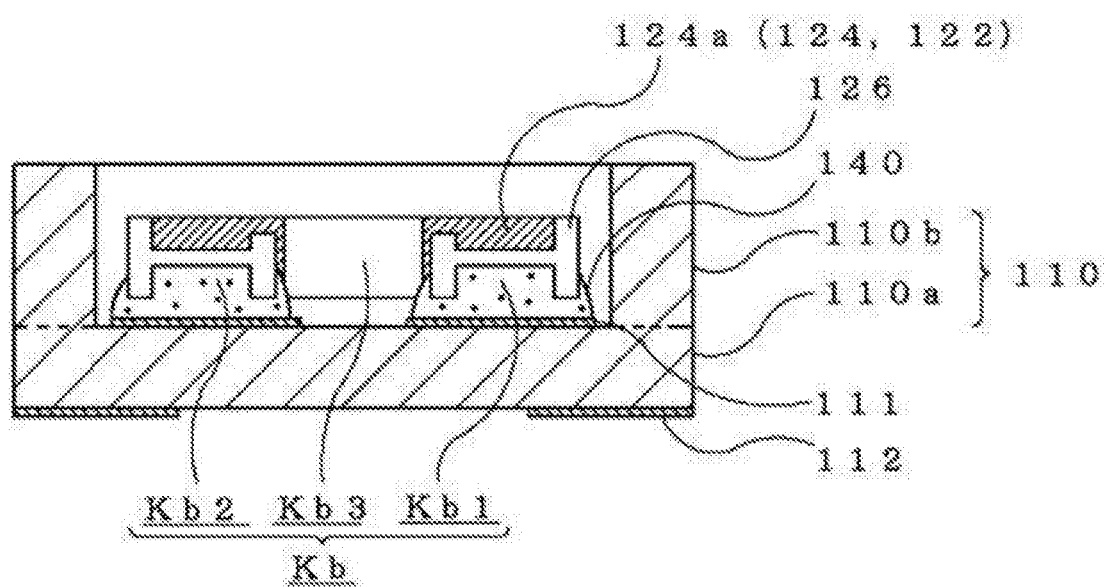
FIG. 10 is a sectional view taken a line a line B-B of FIG. 9.

FIG. 1 and FIG. 2 are drawings regarding a crystal oscillator that is an example of the crystal device according to an embodiment of the present disclosure. FIG. 3 to FIG. 8 are drawings regarding the crystal element according to the embodiment of the present disclosure. FIG. 9 and FIG. 10 are state drawings for describing a state where the crystal element according to the embodiment is mounted on a base body.

The crystal oscillator is an electronic component that is roughly in a thin cuboid shape as a whole, for example, and the dimension thereof may be set as appropriate. For example, the length of the long-sides or short-sides is 0.6 mm to 7.5 mm, and the thickness is 0.2 mm to 1.2 mm. For a relatively smaller one, the length of the long-sides or short-sides is 0.6 mm to 3.2 mm, and the thickness is 0.2 mm to 0.8 mm.

The crystal oscillator includes a base body 110 where an element housing space is located, a crystal element 120 housed within the element housing space, and a lid body 130 that covers the element housing space, for example. The element housing space is sealed by the lid body 130, and the inside thereof is evacuated, for example, or has a proper gas (for example, nitrogen) enclosed therein.

The base body 110 includes a substrate part 110a to be the main part of the base body 110, a mount pad 111 for mounting the crystal element 111, and external terminals 112 for mounting the crystal oscillator to a circuit board or the like, not shown. The substrate part 110a includes a conductor (not shown) for electrically connecting the mount pad 111 to two prescribed external terminals 112. The conductor, not shown, is located on the surface and/or inside of the base body 110. The base body 110 includes a frame-shaped frame part 110b for forming the element housing space in the base body 110, for example. Further, the frame part 110b is located along an edge of the top face of the substrate part 110a. The substrate part 110a and the frame part 110b configuring the base body 110 contain an insulating material such as ceramics, and the mount pad 111 and the external terminals 112 are configured with a conductive layer made of metal or the like, for example.

The lid body 130 is made of metal, for example, and joined to the top face of the base body 110 by seam welding or the like.

The crystal element 120 includes a crystal piece 121 and a pair of metal patterns 122 located on the crystal piece 121.

The crystal piece 121 is what is called an AT cut crystal piece. That is, when an orthogonal coordinate system XYZ configured with X-axis (electrical axis), Y-axis (mechanical axis), and Z-axis (optical axis) is rotated, for example, by 30 degrees to 45 degrees (35 degrees 15 minutes as an example) about the X-axis to define an orthogonal coordinate system XY'Z' in a crystal, there are a pair of main surfaces that are parallel to an XZ' plane.

The crystal element 120 includes the crystal piece 121 and a pair of metal patterns 122 located on the crystal piece 121. The metal patterns 122 are configured with a pair of excitation electrode parts 123 that apply a voltage to the crystal piece 121 and a pair of connection lead parts 124 for mounting the crystal element 120 on the mount pad 111 of the base body 110.

The excitation electrode parts 123 are provided as a pair, and located on the center side of both main surfaces of the crystal piece (that is, by being isolated from the outer edges of the main surfaces of the crystal piece 121), for example.

The pair of connection lead parts 124 are configured with a connection part 124a and a lead part 124b. There are two connection parts 124a located side by side along an edge of the first short-side of the crystal piece 121, for example. The lead part 124b is for electrically connecting the excitation electrode part 123 and the connection part 124a, and a first end thereof is connected to the excitation electrode part 123 while a second end thereof is connected to the connection part 124a. The lead part 124b is located to be in parallel to the long-sides of the crystal piece 121, for example. Note that the lead part 124b may be extendedly provided toward the long-side of the crystal piece 121 from the excitation electrode part 123 and extendedly provided to the connection part 124a along the edge of the long-side of the crystal piece 121 as long as it is possible to electrically connect the excitation electrode part 123 and the connection part 124a.

The crystal element 120 is housed within the element housing space of the base body 110, for example, with the main surface of the crystal piece 121 being opposed to the top face of the substrate part 110a of the main body 110. The connection part 124a of the connection lead part 124 is joined to the mount pad 111 of the base body 110 by a conductive member 140. Thereby, the crystal element 120 is supported by the substrate part 110a of the base body 110 in a cantilever manner. In this state, the connecting part 124a of the connection lead part 124 and the mount pad 111 of the base body 110 are in an electrically-connected state. Therefore, the pair of excitation electrode parts 123 are electrically connected to the connection lead parts 124, the conductive member 140, the mount pad 111 and, by extension, to any two terminals 112 out of a plurality of external terminals 112. The conductive member 140 is made of a conductive adhesive, for example.

The crystal oscillator is mounted on the circuit board with the bottom face of the base body 110 being opposed to the mount face of the circuit board, not shown, and the external terminals 112 being joined onto the pad of the circuit board by solder or the like. An oscillation circuit, for example, is formed in the circuit board. The oscillation circuit generates oscillation signals by applying an alternating voltage to the pair of excitation electrode parts 123 via the external terminals 112 and the mount pad 111. At this time, the oscillation circuit utilizes basic wave vibration out of the thickness shear vibration of the crystal piece 121, for example.

(Outline of Crystal Element)

Figure 3:
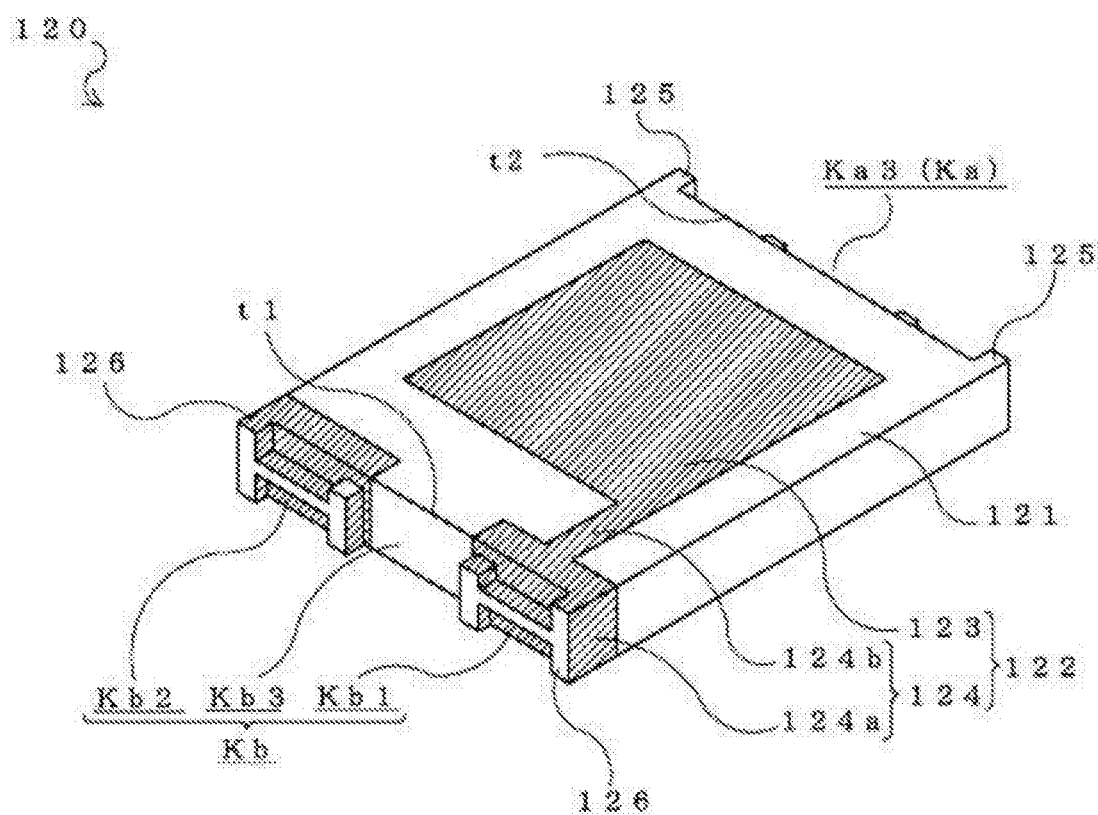
FIG. 3 is a perspective view showing a crystal element according to the embodiment.
Figure 4:
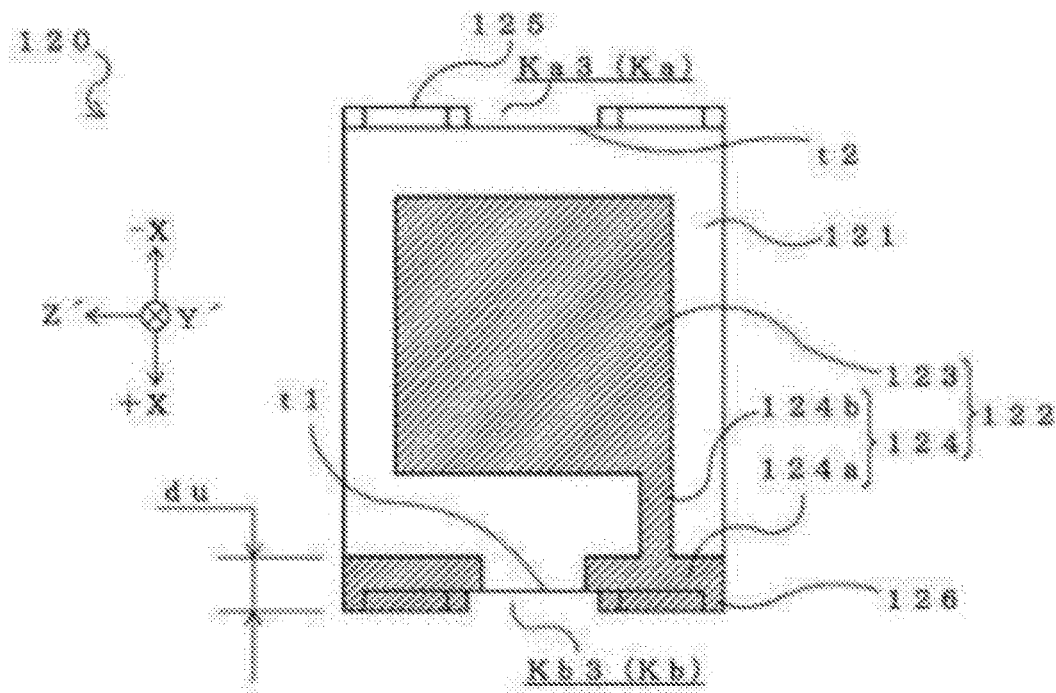
FIG. 4 is a plan view showing a top face of the crystal element according to the embodiment.
Figure 5:
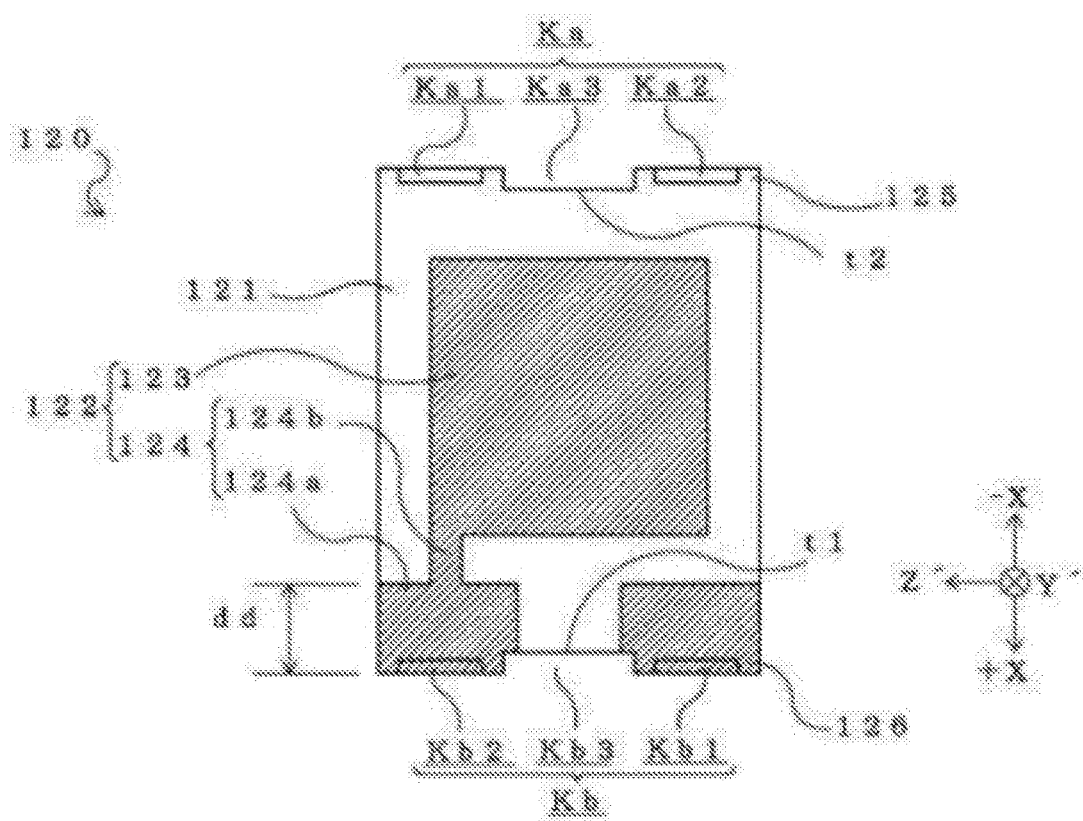
FIG. 5 is a plan view showing a bottom face of the crystal element according to the embodiment viewed from the top face side.
Figure 6:
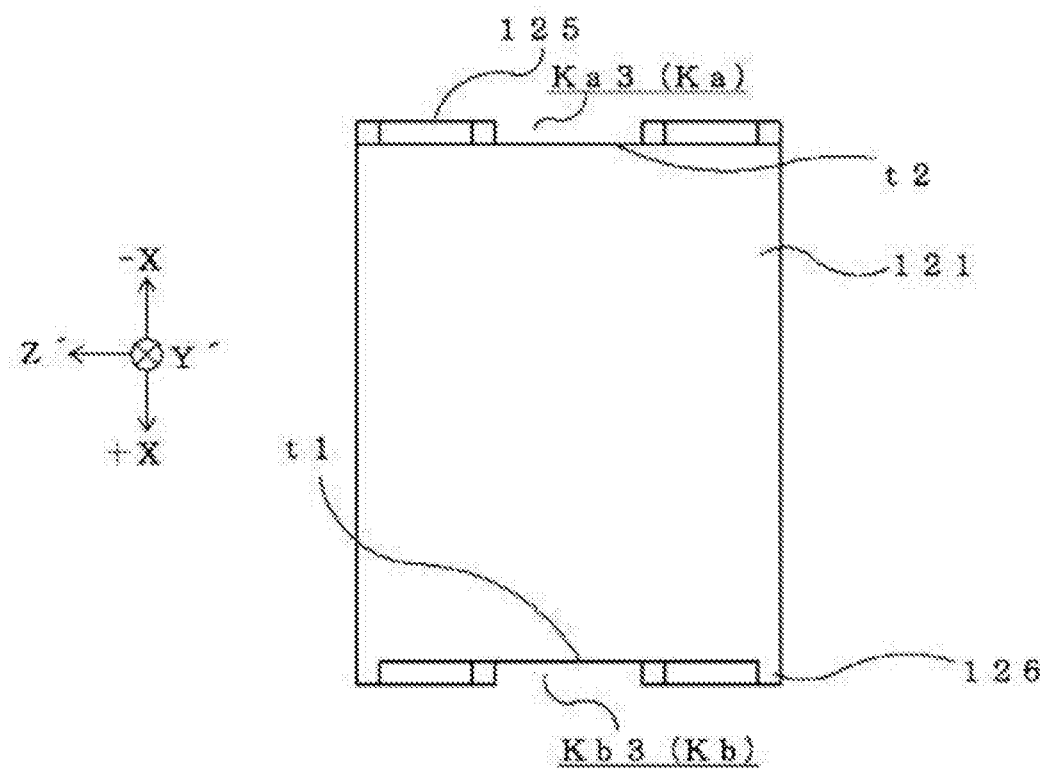
FIG. 6 is a plan view showing a top face of a crystal piece used in the crystal element according to the embodiment.
Figure 7:
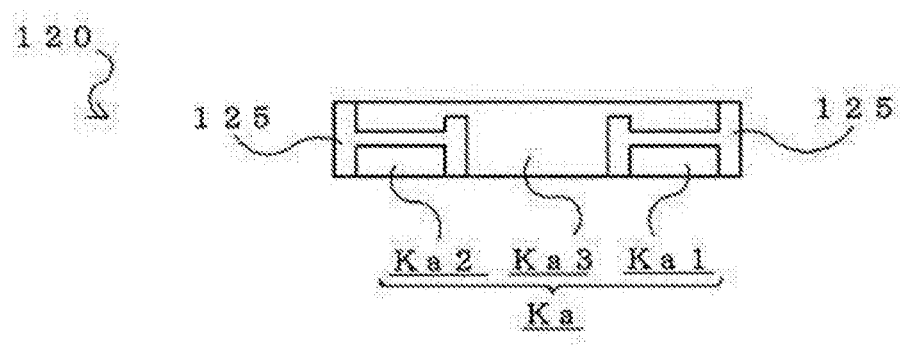
FIG. 7 is a side view showing a side face including a second short-side of the crystal element according to the embodiment.
Figure 8:
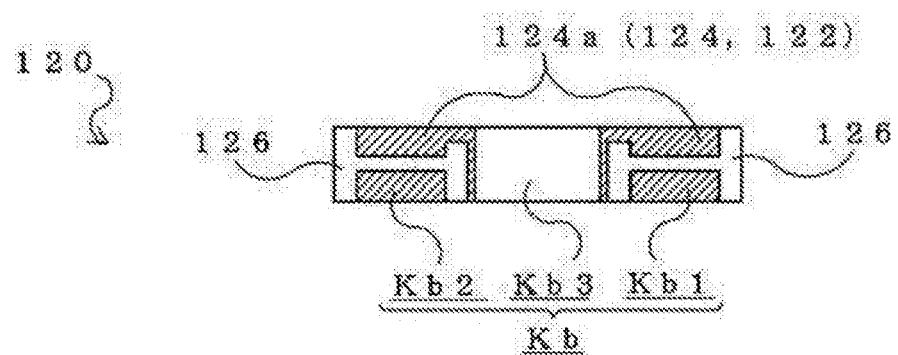
FIG. 8 is a side view showing a side face including a first short-side of the crystal element according to the embodiment.

FIG. 3 to FIG. 8 are drawings regarding the crystal element according to the embodiment. FIG. 3 is a perspective view of the crystal element according to the embodiment. FIG. 4 and FIG. 5 are plan views of the top face and the bottom face of the crystal element according to the embodiment, and FIG. 7 and FIG. 8 are side views of the side face including the short-side of the crystal element according to the embodiment. FIG. 6 is a plan view of the crystal piece used in the crystal element according to the embodiment. FIG. 9 and FIG. 10 are state drawings for describing a state where the crystal element according to the embodiment is mounted on the base body. FIG. 9 is a plan view showing the state of the crystal element viewed from the top face side when the crystal element is mounted on the base body, and FIG. 10 is a sectional view taken along a line B-B of FIG. 9. As shown in FIG. 3 to FIG. 6, the crystal element 120 is configured with the crystal piece 121 and the metal patterns 122 including the excitation electrode parts 123 and the connection lead parts 124.

(Details of Crystal Piece)

As shown in FIG. 6, the crystal piece 121 is roughly in a rectangular shape with the longitudinal direction being the X-axis direction. The crystal piece 121 has a pair of short-sides t1 and t2 opposing to each other in the X-axis direction (parallel to the direction that is vertical to the X-axis). Further, the crystal piece 121 has a pair of long-sides that connect both ends of the pair of short-sides t1 and t2. While the term "side" strictly means a straight line, it may also be a line other than a straight line in the embodiment for convenience' sake.

The first short-side t1 out of the pair of short-sides t1 and t2 is the short-side located on the +X-axis side that is a crystal axis of the crystal on a plan view of the crystal piece 121, and the second short-side t2 is the short-side located on the −X-axis side that is a crystal axis of the crystal.

The crystal piece 121 includes projected parts 126 located at both ends of the first short-side t1. In another viewpoint, the projected parts 126 are projected from the both ends of the first short-side t1 of the crystal piece 121 toward the +X-axis direction on a plan view of the crystal piece 121.

On a plan view (side view) of the side face of the crystal piece 121 including the first short-side t1 of the crystal piece 121 where the projected parts 126 are located, recessed parts Kb (Kb1, Kb2, and Kb3) are located as shown in FIG. 8.

The recessed parts Kb are configured with the first recessed part Kb1, the second recessed part Kb2, and the third recessed part Kb3, for example. The first recessed part Kb1 is located on the first end side of the first short-side t1 of the crystal piece 121 by being connected to the bottom face of the crystal piece 121 as shown in FIG. 8. The second recessed part Kb2 is located on the second end side of the first short-side t1 of the crystal piece 121 by being connected to the bottom face of the crystal piece 121 as shown in FIG. 8. The third recessed part Kb3 is located by being connected to the top face and the bottom face of the crystal piece 121 while going through the midpoint of the first short-side t1 of the crystal piece 121 as shown in FIG. 8.

The crystal piece 121 has convex parts 125 located on both ends of the second short-side t2. In another viewpoint, the convex parts 125 are projected from the both ends of the second short-side t2 of the crystal piece 121 toward the −X-axis direction on a plan view of the crystal piece 121.

On a plan view (side view) of the side face of the crystal piece 121 including the second short-side t2 of the crystal piece 121 where the convex parts 125 are located, concave parts Ka (Ka1, Ka2, and Ka3) are located as shown in FIG. 7.

The convex parts Ka are configured with the first concave part Ka1, the second concave part Ka2, and the third concave part Ka3, for example. The first concave part Ka1 is located on the first end side of the second short-side t2 of the crystal piece 121 by being connected to the bottom face of the crystal piece 121 as shown in FIG. 7. The second concave part Ka2 is located on the second end side of the second short-side t2 of the crystal piece 121 by being connected to the bottom face of the crystal piece 121 as shown in FIG. 7. The third concave part Ka3 is located by being connected to the top face and the bottom face of the crystal piece 121 while going through the midpoint of the second short-side t2 of the crystal piece 121 as shown in FIG. 7.

Various kinds of dimensions of the crystal piece 121 may be set as appropriate. For example, the length (in the X-axis direction) of the crystal piece 121 is 0.4 mm to 7.2 mm, and the length of the short-sides t1, t2 of the crystal piece 121 is 0.3 mm to 5.0 mm.

(Details of Metal Pattern)

The metal pattern 122 includes the excitation electrode part 123 and the connection lead part 124, and located on the surface of the crystal piece 121 as shown in FIG. 3 to FIG. 6.

The connection lead part 124 includes the connection part 124a and the lead part 124b as shown in FIG. 3 to FIG. 5.

The connection parts 124a are the both ends of the first short-side t1 of the crystal piece 121, and located over the top face, the bottom face, and the side face of the crystal piece 121. In this state, as shown in FIG. 3 and FIG. 8, the connection parts 124a are located on the inner wall faces of the first recessed part Kb1 and the second recessed part Kb2 of the projected parts 126. The connection parts 124a located on the inner wall faces of the first recessed part Kb1 and the second recessed part Kb2 are in contact with the conductive member 140 when the crystal element 120 is mounted on the base body 110 as shown in FIG. 9 and FIG. 10. In another viewpoint, it can be also expressed that the conductive member 140 is filled in the first recessed part Kb1 and the second recessed part Kb2.

The length du of the connection part 124a located on the top face of the crystal piece 121 (length in parallel to the X-axis from the first short-side t1 of the crystal piece 121 to the side of the connection part 124a facing toward the second short-side t2 side of the crystal piece 121 on a plan view of the top face of the crystal element 120) is shorter than the length dd of the connection part 124a located on the bottom face of the crystal piece 121 (length in parallel to the X-axis from the first short-side t1 of the crystal piece 121 to the side of the connection part 124a facing toward the second short-side t2 side of the crystal piece 121 on a perspective plan view of the bottom face the crystal element 120 viewed from the top face side).

(Vibration Generated in Crystal Element)

When an alternating voltage is applied to the excitation electrode parts 123 of the crystal element 120, thickness shear vibration of the fundamental wave is generated in the part sandwiched between the pair of excitation electrode parts 123. The thickness shear vibration of the fundamental wave is generated in the part sandwiched between the pair of excitation electrode parts 123 is defined as the main vibration.

At this time, the main vibration leaks and propagates to the direction toward the outer edge of the crystal piece 121 from the excitation electrode parts 123 on a plan view. The vibration generated in the direction toward the outer edge of the crystal piece 121 from the excitation electrode parts 123 is defined as leakage vibration. When the leakage vibration reaches the outer edge of the crystal piece 121, the leakage vibration is reflected by the side face of the crystal piece 121 and vibration is generated in the direction toward the excitation electrode parts 123 from the outer edge of the crystal piece 121. This vibration reflected by the side face of the crystal piece 121 is defined as reflected vibration.

Further, when an alternating voltage is applied to the excitation electrode parts 123 of the crystal element 120, not only the main vibration but also contour vibration that is secondary vibration is generated. The contour vibration depends on the lengths (length parallel to the X-axis and length parallel to the Z'-axis) of the outer shape of the crystal piece 121.

As described above, the crystal element according to the embodiment utilizes the thickness shear vibration (main vibration) of the fundamental wave generated in the crystal piece. Therefore, when an alternating voltage is applied to the excitation electrode parts 123 in the crystal element and the crystal device, it is considered that the main vibration in a state being influenced by other vibration, specifically by the reflected vibration and the contour vibration, is utilized.

As described above, the crystal element 120 according to the embodiment includes the crystal piece 121 that is substantially in a rectangular shape on a plan view, the excitation electrode parts 123 located on the both main surfaces of the crystal piece 121, the connection lead parts 124 extended from the excitation electrode parts 123 to the first short-side t1 of the crystal piece 121, and the convex parts 125 located on the both ends of the second short-side t2 of the crystal piece 121.

As described, by providing the convex parts 125 on the both ends of the second short-side t2 of the crystal piece 121, the frequency of the contour vibration that depends on the length of the crystal piece 121 can be dispersed. Further, such configuration makes it possible to extend the length between the edge of the excitation electrode parts 123 and end of the long-side of the crystal piece 121 on the second short-side t2 side of the crystal piece 121 to be longer than that of a case without the convex parts 125. Therefore, it is possible to decrease the influence of the reflected vibration generated at the end of the long-side of the crystal piece 121 on the second short-side t2 side of the crystal piece 121 imposed upon the main vibration, so that deterioration in the electrical characteristic of the crystal element 120 can be suppressed.

Further, the crystal element 120 has the concave parts Ka located in the convex parts 125 on a plan view of the side face of the crystal piece 121 including the second short-side t2 of the crystal piece 121.

As described, by forming the concave parts Ka in the side face including the second short-side t2 of the crystal piece 121, it is possible to partially change the length in the second short-side t2 of the crystal piece 121. Therefore, the frequency of the secondary contour vibration generated in the vicinity of the second short-side t2 of the crystal piece 121 can be dispersed, so that deterioration in the electrical characteristic of the crystal element 120 can be suppressed.

Further, by providing the first concave part Ka1 and the second concave part Ka2 in the convex parts 125, it is possible to disperse the leakage vibration and the reflected vibration in the convex parts 125 where the concave parts Ka are located so that the influence of the reflected vibration imposed upon the main vibration can be decreased. As a result, deterioration in the electrical characteristic of the crystal element 120 can be suppressed.

Further, the crystal element 120 according to the embodiment includes the projected parts 126 located on both ends of the first short-side t1 of the crystal piece 121.

As described, by providing the projected parts 126 on the both ends of the first short-side t1 of the crystal piece 121, the frequency of the contour vibration that depends on the length of the crystal piece 121 can be dispersed. Further, such configuration makes it possible to extend the length between the edge of the excitation electrode parts 123 and end of the long-side of the crystal piece 121 on the first short-side t1 side of the crystal piece 121 to be longer than that of a case without the projected parts 126. Therefore, it is possible to decrease the influence of the reflected vibration generated at the end of the long-side of the crystal piece 121 on the first short-side t1 side of the crystal piece 121 imposed upon the main vibration, so that deterioration in the electrical characteristic of the crystal element 120 can be suppressed.

Further, the crystal element 120 has the recessed parts Kb located in the projected parts 126 on a plan view of the side face of the crystal piece 121 including the first short-side t1 of the crystal piece 121.

As described, by forming the recessed parts Kb in the side face including the first short-side t1 of the crystal piece 121, it is possible to partially change the length in the first short-side t1 of the crystal piece 121. Therefore, the frequency of the secondary contour vibration generated in the vicinity of the first short-side t1 of the crystal piece 121 can be dispersed, so that deterioration in the electrical characteristic of the crystal element 120 can be suppressed.

Further, by providing the first recessed part Kb1 and the second recessed part Kb2 in the projected parts 126, it is possible to disperse the leakage vibration and the reflected vibration in the projected parts 126 where the recessed parts Kb are located so that the influence of the reflected vibration imposed upon the main vibration can be decreased. As a result, deterioration in the electrical characteristic of the crystal element 120 can be suppressed.

The crystal device according to the embodiment of the present disclosure includes: the crystal element 120 described above; the base body 110 having the substrate part 110a as the main body with the mount pad 111 being located on the top face, the mount pad 111 being electrically connected to a part of the connection lead parts 124 of the crystal element 120, specifically the connection parts 124a; the lid body 130 that is joined with the base body 110 and air-tightly seals the crystal element 120; and the conductive member 140 that electrically connects a part of the connection lead parts 124 and the mount pad 111.

By using the crystal element 120 that is capable of suppressing deterioration in the electrical characteristic as described above, it is possible to improve the electrical characteristic of the crystal device.

Further, in the crystal device according to the embodiment of the present disclosure, the conductive member 140 is filled within the recessed parts Kb located in the projected parts 126, specifically, within the first recessed part Kb1 and the second recessed part Kb2.

Such configuration makes it possible to suppress spread and short-circuit of the neighboring conductive members 140 on the bottom face of the crystal piece 121 by being smashed by the weight of the crystal element 120 with the walls of the first recessed part Kb1 and the second recessed part Kb2, when the crystal element 120 is mounted on the base body 110 by the conductive member 140.

Further, such configuration makes it possible to widen the bonding area between the crystal element 120 and the conductive member 140 compared to a case where the recessed parts Kb are not formed, so that the bonding strength can be increased. As a result, it is possible to suppress deterioration in the electrical characteristic of the crystal device when the crystal device falls off.

The present disclosure is not limited to the embodiment described above but may also be implemented in various other modes. Further, the term "located" may be replaced with "provided" or "formed". The term "extended" may be replaced with "extendedly provided".

The crystal device is not limited to the crystal oscillator. For example, the crystal device may be an oscillator that includes a part to be a crystal oscillator and a part to be an oscillation circuit. Further, the crystal oscillator may include other electronic components such as a thermistor, a diode, and a transistor other than the crystal element.

The crystal element may not be a flat-plate shape but may be in a mesa-shape in which the center part is formed thick.

The excitation electrode may not be in a substantially rectangular shape but may be in a circular shape or an elliptical shape.

The connection lead part may not be extendedly provided in a straight form along the X-axis direction but may be extendedly provided along the short-side of the crystal piece after being extendedly provided to the long-side of the crystal piece, for example.

Figure 11:
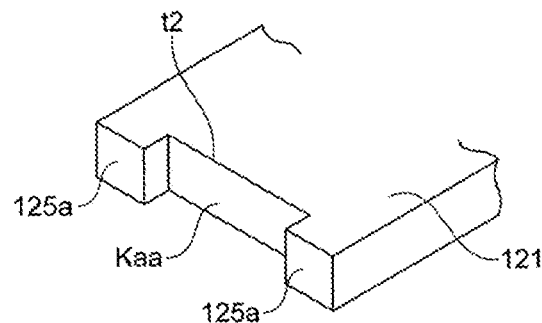
FIG. 11 is a perspective view showing another embodiment (First Example) of a convex part and a concave part in the crystal element according to the embodiment.
Figure 12:
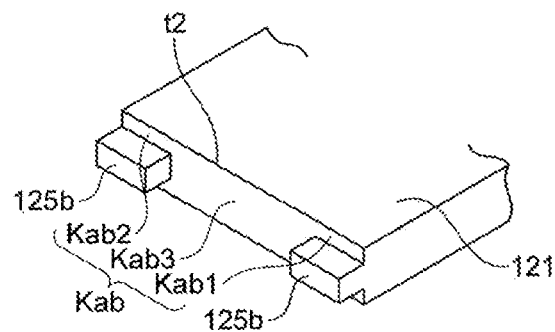
FIG. 12 is a perspective view showing still another embodiment (Second Example) of the convex part and the concave part in the crystal element according to the embodiment.
Figure 13:
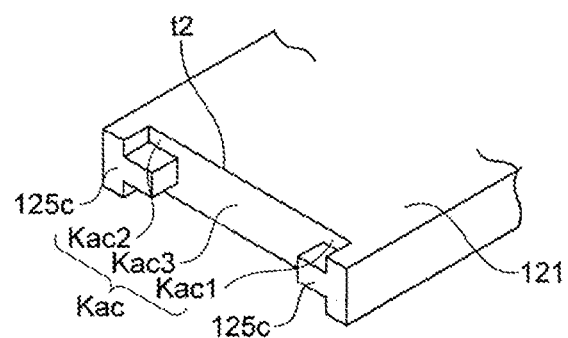
FIG. 13 is a perspective view showing yet another embodiment (Third Example) of the convex part and the concave part in the crystal element according to the embodiment.

Other embodiments of the convex part and the concave part will be described by referring to FIG. 11 to FIG. 13. FIG. 11 shows convex parts 125a and a concave part Kaa according to First Example, FIG. 12 shows convex parts 125b and concave parts Kab according to Second Example, and FIG. 13 shows convex parts 125c and concave parts Kac according to Third Example. On a plan view of the side face including the short-side t2 of the crystal piece 121, the convex parts 125a are in a substantially square shape, the convex parts 125b are in a substantially I-letter shape facing sideways, and the convex parts 125c are in a substantially T-letter shape facing sideways. On a plan view of the side face including the short-side t2 of the crystal piece 121, the concave parts Kab include a first concave part Kab1, a second concave part Kab2, and a third concave part Kab3, while the concave parts Kac include a first concave part Kac1, a second concave part Kac2, and a third concave part Kac3. The first concave part Kab1 and the second concave part Kab2 may be provided on either one of the upper side or the lower side in FIG. 12. The first concave part Kac1 and the second concave part Kac2 may be provided on either one of the upper side or the lower side in FIG. 13.

Figure 14:
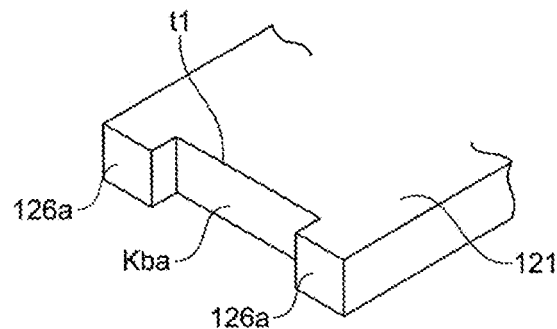
FIG. 14 is a perspective view showing another embodiment (First Example) of a projected part and a recessed part in the crystal element according to the embodiment.
Figure 15:
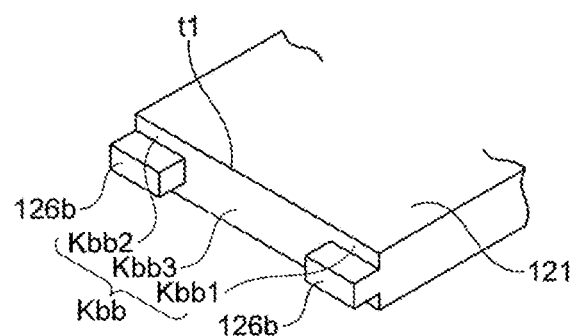
FIG. 15 is a perspective view showing still another embodiment (Second Example) of the projected part and the recessed part in the crystal element according to the embodiment.
Figure 16:
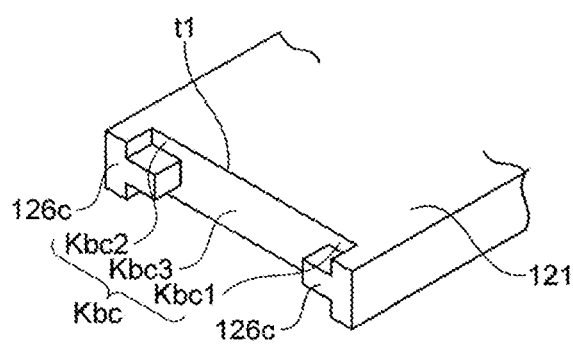
FIG. 16 is a perspective view showing yet another embodiment (Third Example) of the projected part and the recessed part in the crystal element according to the embodiment.

Other embodiments of the projected part and the recessed part will be described by referring to FIG. 14 to FIG. 16. FIG. 14 shows projected parts 126a and a recessed part Kba according to First Example, FIG. 15 shows projected parts 126b and recessed parts Kbb according to Second Example, and FIG. 16 shows projected parts 126c and recessed parts Kbc according to Third Example. On a plan view of the side face including the short-side t1 of the crystal piece 121, the projected parts 126a are in a substantially square shape, the projected parts 126b are in a substantially I-letter shape facing sideways, and the projected parts 126c are in a substantially T-letter shape facing sideways. On a plan view of the side face including the short-side t1 of the crystal piece 121, the recessed parts Kbb include a first recessed part Kbb1, a second recessed part Kbb2, and a third recessed part Kbb3, while the recessed parts Kbc include a first recessed part Kbc1, a second recessed part Kbc2, and a third recessed part Kbc3. The first recessed part Kbb1 and the second recessed part Kbb2 may be provided on either one of the upper side or the lower side in FIG. 15. The first recessed part Kbc1 and the second recessed part Kbc2 may be provided on either one of the upper side or the lower side in FIG. 16.

What is claimed is:

1. A crystal element, comprising:
   a crystal piece that is in a substantially rectangular shape on a plan view;
   an excitation electrode part located on both main surfaces of the crystal piece;
   a connection lead part extended to a first short-side of the crystal piece from the excitation electrode part;
   a convex part located on both ends of a second short-side of the crystal piece; and
   a concave part located in the convex part on a plan view of a side face of the crystal piece including the second short-side of the crystal piece.

2. The crystal element according to claim 1, comprising a projected part located on the both ends of the first short-side of the crystal piece.

3. The crystal element according to claim 2, comprising a recessed part located in the projected part on a plan view of a side face of the crystal piece including the first short-side of the crystal piece.

4. A crystal device, comprising:
   the crystal element according to claim 1;
   a base body having a substrate part as a main body with a mount pad located on a top face of the substrate part, the mount pad being electrically connected to a part of the connection lead part of the crystal element;
   a lid body that is joined to the base body and air-tightly seals the crystal element; and
   a conductive member that electrically connects the part of the connection lead part and the mount pad.

5. A crystal device, comprising:
   the crystal element according to claim 3;
   a base body having a substrate part as a main body with a mount pad located on a top face of the substrate part, the mount pad being electrically connected to a part of the connection lead part of the crystal element;
   a lid body that is joined to the base body and air-tightly seals the crystal element; and
   a conductive member that electrically connects the part of the connection lead part and the mount pad, wherein the conductive member is filled within the recessed part.

* * * * *